United States Patent [19]

Yamagishi et al.

[11] Patent Number: 5,258,092
[45] Date of Patent: Nov. 2, 1993

[54] METHOD OF GROWING SILICON MONOCRYSTALLINE ROD

[75] Inventors: Hirotoshi Yamagishi; Masanori Kimura; Hideo Arai, all of Annaka, Japan

[73] Assignee: Shin-Etsu Handotai Co., Ltd., Tokyo, Japan

[21] Appl. No.: 855,978

[22] Filed: Mar. 23, 1992

[30] Foreign Application Priority Data

Mar. 22, 1991 [JP] Japan .................................. 3-081159
Oct. 28, 1991 [JP] Japan .................................. 3-307127

[51] Int. Cl.$^5$ .............................................. C30B 29/06
[52] U.S. Cl. .............................. 156/616.2; 156/620.7; 156/620.73; 156/620.74; 156/602
[58] Field of Search ................. 156/603, 616.2, 620.7, 156/620.71, 620.73, 620.74, DIG. 64

[56] References Cited

U.S. PATENT DOCUMENTS

| | | | |
|---|---|---|---|
| 3,086,856 | 4/1963 | Siebertz | 156/620.72 |
| 3,211,881 | 10/1965 | Jablonski et al. | 156/620.74 |
| 3,232,745 | 2/1966 | Rummel et al. | 156/620.73 |
| 3,351,433 | 11/1967 | Keller | 156/617.1 |
| 3,607,139 | 9/1971 | Hanks | 156/617.1 |

FOREIGN PATENT DOCUMENTS 50-13155  5/1975  Japan.

OTHER PUBLICATIONS

De Leon, "Growth of Homogeneous High Resistivity FZ Silicon Crystals Under Magnetic Filed Bias", *J. of Crystal Growth*, 55:406–08 (1981).

*Primary Examiner*—Olik Chaudhuri
*Assistant Examiner*—Felisa Garrett
*Attorney, Agent, or Firm*—Evenson, McKeown, Edwards & Lenahan

[57] ABSTRACT

The present invention is intended to provide a method of growing a silicon monocrystalline rod by an FZ process, wherein the dopant distribution of the silicon monocrystalline rod in the diametrical direction is made microscopically uniform, characterized in that a magnetic field forming means is arranged above and/or below a melting zone of said silicon monocrystalline rod to surround said silicon monocrystalline rod and a magnetic field is applied to the melting zone of the silicon monocrystalline rod through said magnetic forming means, and preferably the magnetic field forming means is constituted by supplying a direct electric current through a solenoid coil surrounding said silicon monocrystalline rod.

6 Claims, 7 Drawing Sheets

FIG. 3

| DIAMETER (mm) OF MONOCRYSTALLINE SILICON ROD | 75 mm | | | | | | 100 mm | | | | | 125 mm | | | | |
|---|---|---|---|---|---|---|---|---|---|---|---|---|---|---|---|---|
| NUMBER OF ROTATIONS (rpm) OF LOWER SHAFT | 5 | 6 | 7 | 8 | 9 | 10 | 4 | 5 | 6 | 7 | 8 | 0.5 | 1 | 2 | 3 | 4 |
| MAGNETIC FIELD INTENSITY (gauss) 0 | 19.2 | 17.5 | 16.0 | 19.8 | 26.2 | 31.9 | 29.2 | 31.7 | 22.1 | 25.3 | 32.5 | 35.5 | 24.6 | 25.4 | 26.9 | 30.0 |
| 150 | — | — | — | — | — | — | — | — | 16.4 | — | — | — | — | 22.7 | — | — |
| 190 | — | — | — | — | — | — | — | — | — | — | — | — | — | 13.9 | — | — |
| 200 | — | — | 15.5 | — | — | — | — | — | — | — | — | — | — | — | — | — |
| 220 | — | — | — | — | — | — | 16.5 | 11.8 | 12.1 | — | — | 34.6 | 13.6 | 10.5 | 14.5 | 23.3 |
| 250 | 17.7 | 11.5 | — | — | — | — | — | — | 9.7 | 13.6 | 23.4 | — | 12.2 | — | — | — |
| 300 | — | — | 12.5 | — | — | — | — | — | 13.8 | — | — | — | — | 14.5 | — | — |
| 400 | — | — | 12.5 | — | — | — | — | — | 23.3 | — | — | — | — | 20.3 | — | — |
| 500 | — | — | 8.3 | 13.2 | 24.4 | 28.5 | — | — | 27.0 | — | — | — | — | — | — | — |
| 600 | — | — | 14.1 | — | — | — | — | — | — | — | — | — | — | — | — | — |
| 750 | — | — | 28.0 | — | — | — | — | — | — | — | — | — | — | — | — | — |
| 1000 | — | — | 30.9 | — | — | — | — | — | — | — | — | — | — | — | — | — |

FIG. 4

| DIAMETER (mm) OF MONOCRYSTALLINE SILICON ROD | | 75 | 100 | 125 |
|---|---|---|---|---|
| ROTATIONAL SPEED (rpm) OF LOWER SHAFT | | 7 | 6 | 2 |
| MAGNETIC FIELD INTENSITY (gauss) | | 500 | 250 | 220 |
| RIPPLE FACTOR (%) | 3 | 8.3 | 9.7 | 10.5 |
| | 8 | 10.1 | 12.7 | 11.5 |
| | 15 | 16.2 | 17.9 | 21.4 |

FIG. 6

| DIAMETER (mm) OF MONOCRYSTALLINE SILICON ROD | | 150 mm | | | | |
|---|---|---|---|---|---|---|
| NUMBER OF ROTATIONS (rpm) OF LOWER SHAFT | | 0.5 | 1 | 2 | 3 | 4 |
| MAGNETIC FIELD INTENSITY (gauss) | 0 | 40.5 | 42.2 | 43.4 | 48.5 | 49.6 |
| | 100 | 38.5 | 37.9 | 38.1 | 42.5 | 45.3 |
| | 150 | 32.0 | 31.1 | 23.3 | 36.1 | 34.7 |
| | 180 | 26.8 | 25.1 | 16.1 | 21.9 | 24.8 |
| | 185 | 23.1 | 20.3 | 14.2 | 17.9 | 18.0 |
| | 190 | 24.5 | 23.3 | 15.7 | 16.6 | 18.9 |
| | 200 | 27.7 | 26.6 | 18.1 | 18.2 | 26.9 |
| | 250 | 34.5 | 32.2 | 28.5 | 25.6 | 34.1 |

FIG. 7

| DIAMETER (mm) OF MONOCRYSTALLINE SILICON ROD | | 150 |
|---|---|---|
| ROTATIONAL SPEED (rpm) OF LOWER SHAFT | | 2 |
| MAGNETIC FIELD INTENSITY (gauss) | | 185 |
| RIPPLE FACTOR (%) | 3 | 14.2 |
| | 8 | 15.5 |
| | 15 | 17.4 |

METHOD OF GROWING SILICON MONOCRYSTALLINE ROD

BACKGROUND OF THE INVENTION

1. Field of the Invention

The present invention relates to a method of growing a monocrystalline rod, and in particular to a method of growing a high-purity silicon monocrystalline rod having a uniform electric resistivity in the cross-sectional plane perpendicular to the rod axis by an FZ process (floating zone process or floating zone melt process) using a high-frequency induction heating means for heating and melting.

2. Prior Art

Conventionally, as method of growing a silicon monocrystalline rod, the above FZ process and the CZ process (Czochralski process or pulling process) are known.

As is well known, growth of a silicon monocrystalline by the FZ process is carried out as follows:

As shown in FIG. 8 which will be described later, in a chamber 5 a polycrystalline raw material silicon rod 1 having a prescribed diameter is held at the lower end of an upper shaft 10 suspended from above, a prescribed seed crystal 7 is held at the upper end of a lower shaft 8 located below, a high-frequency electric current is passed through a high-frequency heating coil 2 to heat and melt the raw material rod 1 and the seed crystal 7 to fuse them at a constricted part 6, and they are lowered at an extremely slow speed while they are rotated at a prescribed speed so that a melted zone part 4 is moved gradually upward thereby growing a silicon monocrystalline rod 3 having a prescribed diameter.

On the other hand, in the CZ process of growing a silicon monocrystalline, as is well known, a seed crystal having a desired crystal orientation is mounted to the lower end of a pull shaft and the pull shaft is rotated at a prescribed rotational speed and at the same time is pulled up gradually with an end of the seed crystal being dipped in a relatively large amount of a melt of silicon so that a silicon monocrystalline rod having a prescribed diameter is grown and formed.

The distribution of the electric resistivity of the silicon monocrystalline rod grown in the above manner is divided generally into the distribution in the direction of the axis of the growth and the distribution in the cross-sectional plane perpendicular to the axis. The distribution of electric resistivity in the direction of the axis of the growth and the distribution of electric resistivity in the cross-sectional plane in the FZ process and the CZ process will now be discussed below.

First, in the CZ process, when the silicon melt of a liquid phase adhered to the seed crystal solidifies to a silicon monocrystal of a solid phase, segregation of the dopant substance occurs, the concentration of the dopant gradually increases, and the electric resistivity decreases with the growth of the crystal, resulting in an increase in nonuniformity of electric resistivity in the direction of the axis of the growth.

In the FZ process, since a silicon melt is supplied continuously from above to a relatively small limited amount of the silicon melt at the part where the growth takes place, the dopant concentration in the direction of the axis of the growth decreases in a macroscopic sense more greatly than in the case of the CZ process and the distribution of the electric resistivity in the direction of the axis of the growth is made uniform, but on the other hand, in the FZ process, since the amount of the silicon melt at the part where the growth takes place is relatively small and a silicon melt is continuously supplied from above, the dopant substance is taken in irregularly in a microscopic amount with a change in convection in the melt at the growth part, thereby increasing nonuniformity in the distribution of electric resistivity in the cross-sectional plane perpendicular to the axis.

FIG. 2(a) is a graph of an example of the rate A of change of the electric resistivity of a silicon wafer in the cross-sectional plane, which silicon wafer was obtained by growing a silicon monocrystalline rod which had a diameter of 100 mm and whose growth orientation was $<111>$ by rotating it at a speed of 6 rpm and slicing the rod into a wafer having a thickness of 300 μm.

In FIG. 2(a), the rate A of change of the electric resistivity R is defined as follows:

$$A = [(Rmax - Rmin)/Rave] \times 100\ (\%)$$

wherein Rmax denotes the maximum value of the measured electric resistivity R, Rmin denotes the minimum value of the measured electric resistivity R, and Rave denotes the average value of the electric resistivity R in the wafer plane, and the rate a of variation of the electric resistivity in the cross-sectional plane is defined as follows:

$$a = [(Rmax - Rmin)/Rmin] \times 100\ (\%).$$

In this case, the reason why the value of the rate A of change of the electric resistivity R is used instead of simply plotting the electric resistivity R is to avoid that the rate A of change of the actual electric resistivity R appears great as the electric resistivity R increases and that depending on the rate a of variation of the electric resistivity R in the cross-sectional plane, the variation of the electric resistivity R can be expressed as one numerical value and the distributions of the electric resistivities R can be assessed by comparing them mutually.

Thus, as apparent from the graph shown in FIG. 2(a), it can be understood that the rate A of change of the electric resistivity R decreases near the central part of the wafer and that its distribution of the electric resistivity in the cross-sectional plane is nonuniform. The value of the rate a of variation of the electric resistivity R in the cross-sectional plane is 22.1%.

Thus, in the growth of an individual silicon monocrystalline rod, that is, in the production of a silicon wafer, it is demanded that the value of the rate a of variation of the electric resistivity R in the cross-sectional plane is small as far as possible and, in some cases of devices which are subject to severe restrictions, the rate a of variation of the electric resistivity R is required to be 3% or below.

Therefore in such a case it is known to take such measures that a prescribed silicon monocrystalline rod is grown by an FZ process without using a dopant substance in the silicon melt and then, for example, the obtained silicon monocrystalline rod is loaded in a nuclear reactor and is irradiated with thermal neutrons so that the doping with a dopant formed by changing $^{30}$Si to $^{31}$P by a nuclear reaction may be effected. This neutron irradiation doping method requires, however, nuclear reaction facilities and therefore is attended with a disadvantage that the production cost of silicon wafers increases considerably. Thus, means of growing industrially a silicon monocrystalline rod wherein the value of the rate a of variation of the electric resistivity R in the cross-sectional plane is small is desired to be suggested.

With respect to the amounts of silicon melts at parts where growth takes place in the FZ process and the CZ process, in the former process the amount is about 1/100 to 1/1,000 of that of the latter process and since it is assumed that the state of convection in the silicon melt is difficult to control artificially not as in the CZ process, it is considered that unevenness of the concentration distribution of the dopant in the cross-sectional plane in the silicon monocrystalline rod formed by the FZ process, that is, the nonuniform distribution of the electric resistivity cannot be obviated.

The convection in the silicon melt included in the growth of a silicon monocrystalline rod by the FZ process involves forced convection caused by the rotation of a seed crystal, natural convection caused by heating by a high-frequency heating coil, and surface tension convection induced by the melt free surface which would increase far more largely in comparison to an increase in the volume of the silicon melt.

To suppress the rates of the natural convection and the surface tension convection as far as possible, it is considered to cause the forced convection to work against these convections, but since, in the FZ process, the amount of the silicon melt at a part where growth takes place is small, the forced convection lacks in strength and therefore secures hardly a desired counteraction to the natural convection and the surface tension convection. Further, although it can be conceived that the silicon monocrystalline rod in the process of the growth is rotated at a higher speed to cause the forced convection to work more strongly, since initially in the process of the growth the weight of the silicon monocrystalline rod itself is supported by the constricted part formed at the lower end of the silicon monocrystalline rod, the constricted part cannot withstand such high-speed rotation at all and there is even a danger that the silicon monocrystalline rod itself in the process of the growth will collapse, which makes this idea impractical.

To obviate these problems, for the growth of a silicon monocrystalline rod by an FZ process, a means of applying a magnetic field in parallel with the direction of the growth to a silicon melt was suggested by N. De Leon, J. Guldberg, and J. Salling: J. Cryst. Growth 55 (1981) 406 to 408 and they reported that when a silicon monocrystalline rod having a diameter of 42 mm was grown and formed by applying a magnetic field of 180 gauss or less approximately in parallel with the axis of the growth, in the silicon wafer obtained therefrom, the rate of variation of the electric resistivity in the cross-sectional plane could be restricted to a lower value.

However, with respect to industrial wafers obtained from a silicon monocrystalline rod grown and formed by an FZ process, wafers having a diameter of 75 mm or over are currently demanded mainly. Thus, the production of silicon wafers having a diameter of 50 mm or less reported by N. De Leon et al. cannot meet the current demand at all.

That is, in the above method proposed by N. De Leon et al., during the growth of a silicon monocrystalline rod having a diameter of about 70 mm or over by an FZ process, when a magnetic field of 180 gauss is applied approximately in parallel with the direction of the growth to the silicon melt, the change in the electric resistivity in the cross-sectional plane of the silicon wafer obtained from the thus grown and formed silicon monocrystalline rod becomes such that the electric resistivity R near the central part of the wafer lowers remarkably, so that the value of the rate a of variation of the electric resistivity R in the cross-sectional plane will exceed 20%.

OBJECT OF THE INVENTION

The present invention has been made taking the above conventional point into consideration and an object of the present invention is to provide a method of growing and forming a silicon monocrystalline rod having a diameter of 70 mm or over by an FZ process, wherein doping with irradiation with thermal neutrons is not effected and the dopant distribution of a silicon wafer obtained from the silicon monocrystalline rod in the cross-sectional plane is macroscopically uniform.

SUMMARY OF THE INVENTION

The method of growing a silicon monocrystalline rod according to the present invention is a method of growing and forming a silicon monocrystalline rod having a large diameter of 70 mm or over by an FZ process, characterized in that a magnetic field forming means is arranged above and/or below a melting zone of a silicon monocrystalline rod to be grown in such a manner that the silicon monocrystalline rod to be grown is surrounded by the magnetic field forming means and while the silicon monocrystalline rod is grown a magnetic field is applied to the melting zone of the silicon monocrystalline rod through said magnetic field forming means.

Also, the method of growing a silicon monocrystalline rod according to the present invention is characterized in that said magnetic field forming means is a solenoid coil arranged to surround the silicon monocrystalline rod to be grown and a direct electric current is passed through said solenoid coil.

Also, the method of growing a silicon monocrystalline rod according to the present invention is characterized in that the ripple factor of the direct current passing through the solenoid serving as said magnetic field forming means is restricted to 8% or below.

Also, the method of growing a silicon monocrystalline rod according to the present invention is characterized in that the magnetic field intensity in said magnetic field forming means is set between 190 gauss and 600 gauss.

Also, the method of growing a silicon monocrystalline rod according to the present invention is characterized in that while said magnetic field is applied to the silicon monocrystalline rod to be grown, said silicon single rod to be grown is rotated.

Also, the method of growing a silicon monocrystalline rod according to the present invention is characterized in that the number of rotations of the silicon monocrystalline rod to be grown is set between 1 and 8 per minute.

Also, the method of growing a silicon monocrystalline rod according to the present invention is characterized in that if the diameter of said silicon monocrystalline rod exceeds about 130 mm, the magnetic field intensity in said magnetic field forming means is set between 180 gauss and 200 gauss.

Further, the method of growing a silicon monocrystalline rod according to the present invention is characterized in that if the diameter of said silicon monocrystalline rod exceeds about 130 mm, the number of rotations of the silicon monocrystalline rod to be grown is set between 0.5 and 4 per minute.

Thus, when a silicon monocrystalline rod having a large diameter of about 70 mm or over is grown and formed by an FZ process by setting the conditions of the growth of the silicon monocrystalline rod as above, nonuniform distribution of a dopant in the silicon wafer obtained from the silicon monocrystalline rod in the cross-sectional plane can be obviated without excessively increasing the rotational frequency of a lower shaft.

To generate forced convection in a silicon melt to counteract natural convention and surface tension convection in the process of the growth of a crystal by increasing the number of rotations of the lower shaft at most to about 8 per minute cannot bring about a desired counter effect, which was already confirmed by our experiments, and further although the rotation of the lower shaft can forcibly stir the silicon melt to generate forced convection, the circumferential speed of the rotation which will cause forced convection is null at the center of the rotation and therefore since there is no effect for mixing a dopant by the stirring and the growth at the growth interface is facet growth, a low electric resistivity is exhibited at the center of the rod.

However, when a solenoid coil is arranged a little over or below the silicon melt in such a way that the solenoid coil surrounds a raw material silicon polycrystalline rod or a silicon monocrystalline rod to be grown and when a direct current is passed through the solenoid to form a direct current magnetic field in the axial direction of the growth including the silicon melt, it is presumed that, in the case where the solenoid coil is arranged over the silicon melt, an outwardly bent direct-current magnetic field located above and near the silicon melt and, in the case where the solenoid is arranged below the silicon melt, an outwardly bent direct-current magnetic field located below and near the silicon melt respectively form magnetic lines of force orthogonally to the natural convection and the surface tension convection at the surface of the silicon melt to exhibit a magnetic characteristic effect to suppress the natural convection and the surface tension convection. Since the state of the silicon melt in the FZ process is influenced by the weight of the silicon melt itself, each of the outer surface configurations thereof in the vertical cross-sectional plane is inclined toward the axial direction of the growth and intersects the magnetic lines of force of the solenoid coil.

Further, when a direct current is passed through the solenoid coil to apply a magnetic field and when the direct current contains ripples, it is considered that the rippled component generates an induced eddy current to induce nonuniformity of the flow velocity of the convection and the temperature distribution in the horizontal cross section of the particular melt zone, thereby deteriorating the dopant concentration distribution in said cross section, so that the upper limit of the relevant ripple factor is limited to such an extent that the induced nonuniform distribution can be accepted in practice.

Now the prior art suggested by N. De Leon et al. and the present technique are compared.

As described in part above, N. De Leon et al. reported that, during the growth of a silicon monocrystalline rod having a diameter of 42 mm, the rotational speed of the upper shaft was 7 turns per minute and the rotational speed of the lower shaft was 3.5 turns per minute with the shafts being rotated in opposite directions, and when a magnetic field of up to 180 gauss was applied, the ratio [R (peripheral part)/R (central part)] of the electric resistivity in the radial direction showed a minimum value in the case of a magnetic field of 80 gauss.

If this N. De Leon et al. technique is applied to the present method to grow and form a silicon monocrystalline rod having a diameter of 42 mm, it is estimated that the optimum maximum intensity of the applied magnetic field is 500 gauss or over and that the number of rotations of the lower shaft is 7 or more per minute, and therefore the reported results by N. De Leon et al. become different from the results of the present invention.

The point that, in the present invention, a solenoid coil surrounds a silicon melt from which a silicon monocrystalline is grown by an FZ process and a direct-current magnetic field is applied appears identical to the above technical idea suggested by N. De Leon et al., but, in the present invention, the FZ process used in the present invention is applied to a silicon monocrystalline rod to be grown which has a larger diameter of about 70 mm or over, the high-frequency induction heating coil is a single-winding flat coil, the inner diameter of the coil is at least smaller than the diameter of the silicon monocrystalline rod to be grown, and the length of the silicon melt part is smaller than the diameter of the silicon monocrystalline rod to be grown, so that the present invention is noticeably different from the case of N. De Leon et al. in that the length of the silicon monocrystalline rod relative to the diameter thereof in the present invention is very short in comparison with the silicon monocrystalline rod having a small diameter by N. De Leon et al. and therefore the technical objects of the present invention cannot be achieved at all by merely extending the technique disclosed by N. De Leon et al.

Standing on a position completely different from the technique disclosed by N. De Leon et al., the present inventors have studied in various ways, in a method of growing a silicon monocrystalline rod having a large diameter of about 70 mm or over, the position of a solenoid coil relative to the silicon melt, the direction of magnetic lines of force, the intensity of a magnetic field, the ripple component of a direct current to be passed, the rotational speed of a lower shaft, etc. and have achieved the present invention.

BRIEF DESCRIPTION OF THE DRAWINGS

FIGS. 1a and 1b show schematically the constructions of two silicon monocrystalline growing apparatuses used for the method of growing a silicon monocrystalline rod according to the present invention; wherein FIG. 1(a) is a diagram illustrating the construction in the case in which a solenoid is arranged below a melting zone of a silicon melt and FIG. 1(b) is a diagram illustrating the construction in the case in which a solenoid is arranged above a melting zone of a silicon melt.

FIGS. 2a and 2b show states of the distributions of the rates A of change of the electric resistivity in the cross-sectional planes of silicon monocrystalline rods grown and formed by the method of a first example of the present invention; wherein FIG. 2(a) is a diagram showing the distribution obtained without application of a magnetic field and FIG. 2(b) is a diagram showing the distribution obtained with a magnetic field being applied.

FIG. 3 is a table showing rates a of variation of the electric resistivity in the cross-sectional planes of monocrystalline rods which were obtained when the rotational speed of the lower shaft and the intensity of the applied magnetic field were changed within suitable ranges in the growth and formation of silicon monocrystalline rods having various diameters in accordance with the method of a first example of the present invention.

FIG. 4 is a table showing rates a of variation of the electric resistivity in the cross-sectional planes of monocrystalline rods which were obtained when the ripple factor involved in the direct current for forming an applied magnetic field was changed in the growth of silicon monocrystalline rods having various diameters in accordance with the method of a first example of the present invention.

FIGS. 5a and 5b show states of the distributions of the values of the rates A of the electric resistivity plotted with respect to the distance from the center of the wafer obtained in the method of a second example of the present invention; wherein FIG. 5(a) is a diagram of the distribution in the case wherein a magnetic field is not applied and FIG. 5(b) is a diagram of the distribution in the case wherein a magnetic field is applied.

FIG. 6 is a table showing rates a of variation of the electric resistivity in the cross-sectional planes of monocrystalline rods which were obtained when the rotational velocity of the lower shaft and the intensity of the applied magnetic field were changed within suitable ranges in the growth of silicon monocrystalline rods having various diameters in accordance with the method of a second example of the present invention.

FIG. 7 is a table showing rates a of variation of the electric resistivity in the cross-sectional planes of monocrystalline rods which were obtained when the ripple factor involved in the direct current for forming an applied magnetic field was changed in the growth and formation of silicon monocrystalline rods having various diameters in accordance with the method of a second example of the present invention.

DETAILED DESCRIPTION OF THE INVENTION

Now the present method of growing a silicon monocrystalline rod will be described with reference to examples together with the accompanying drawings.

Herein, it should be noted that the configuration, dimensions, materials, relative positions, etc. of the constitutional parts of the silicon monocrystalline growing apparatuses for an FZ process applied to examples of the present invention as well as the experimental conditions, the dimensions and materials of samples, etc. substantially described in examples are not intended to limit the invention thereto unless otherwise stated, but they are to be considered as illustrative.

Figure 1A:
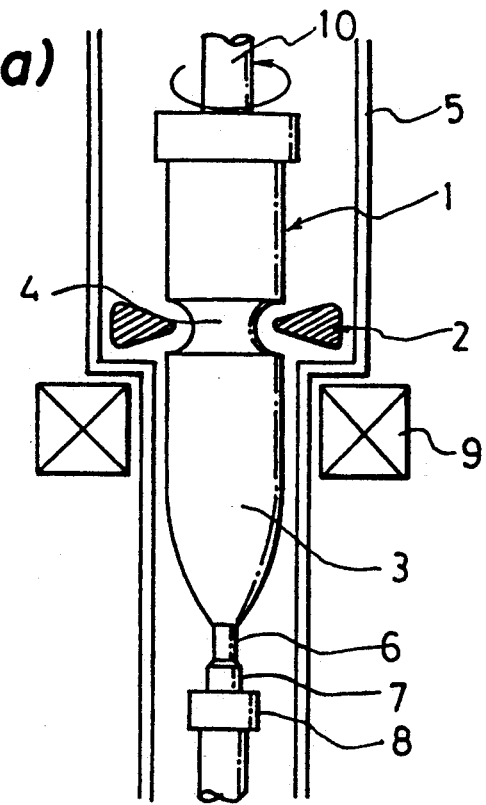
Figure 1B:
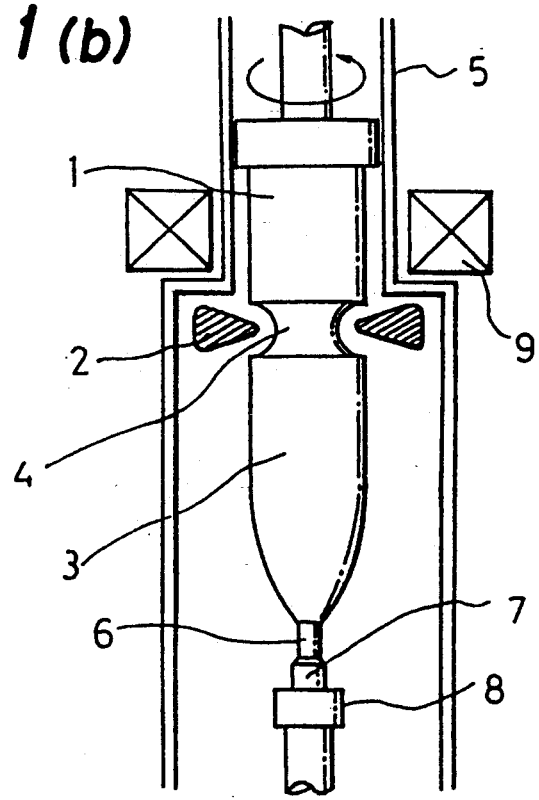

FIGS. 1(a) and 1(b) show schematic diagrams of the constructions of silicon monocrystalline rod growing apparatuses applied to the method of growing a silicon monocrystalline rod using an FZ process according to the present invention, in which apparatuses a raw material polycrystalline silicon rod 1 suspended from above in a chamber 5 is melted by a single-winding high-frequency induction heating coil 2 having an inner diameter of 23 mm and after a seed crystal 7 is fused and dislocation is eliminated by a constricted part 6, a silicon monocrystalline rod 3 having a prescribed diameter can be grown and formed. In the growth of the silicon monocrystalline rod 3, the raw material polycrystalline silicon rod 1 is rotated by an upper shaft 10, the silicon monocrystalline rod 3 to be grown is rotated by a lower shaft 8. The number of rotations of the upper shaft 10 was 0.4 per minute, the number of rotations of the lower shaft 8 was 0.5 to 10 per minute, and the shafts were rotated in the same direction.

FIGS. 1(a) and 1(b) show the constructions of examples, in one of which a solenoid coil 9 is located below the high-frequency induction heating coil 2, the melting zone of a silicon melt, and the crystal growing region and in the other of which a solenoid coil 9 is located above the high-frequency induction heating coil 2, the melting zone of a silicon melt, and the crystal growing region. The solenoid 9 is located below or above an outer wall part of said chamber 5, the distance between the solenoid coil 9 and the center of the high-frequency induction heating coil 2 is about 175 mm, and the axis of the solenoid coil is aligned with the axis of the growth. The solenoid coil 9 has an inner diameter of 210 mm, an outer diameter of 500 mm, and a height of 130 mm.

The silicon monocrystalline growing apparatuses having the above constitutions which are operated by an FZ process were used, doping was carried out by pouring phosphorus as a dopant in the chamber 5, and an n-type silicon monocrystalline rod 3 whose growth orientation is <111> was grown and formed. Particularly, in the first example, silicon monocrystalline rods 3 having diameters of 75 mm, 100 mm, and 125 mm respectively were processed.

A direct electric current having a ripple factor of 8% or below was passed through the solenoid coil 9 and the measured value of the magnetic intensity at the central part of the growth interface was varied in the range of 0 to 1,000 gauss while the crystal was being grown. The number of rotations of the upper shaft 10 was kept constant and was 0.4 per minute and the number of rotations of the silicon monocrystalline rod 3 to be grown was varied in the range of 0.5 to 10 per minute with the upper shaft 10 and the silicon monocrystalline rod 3 being rotated in the same direction.

Each silicon monocrystalline rod 3 grown under the above conditions was removed from the chamber 5, and a silicon wafer having a thickness of 300 μm was cut out from a part of the silicon monocrystalline rod 3 at a prescribed position with a diamond saw and was used as a sample for the measurement of the electric resistivity.

After the electric resistivities R of the silicon wafer, that is, the sample, were measured by the 4-probe measuring method, the measured values were evaluated by defining the rate A of change of the electric resistivities R as follows:

$$A = [(R - Rave)/Rave] \times 100 \ (\%)$$

and the rate a of variation of the electric resistivities in the cross-sectional plane as follows:

$$a = [(Rmax - Rmin)/Rmin] \times 100 \ (\%).$$

wherein Rave denotes the average value of the electric resistivities R in the wafer plane, Rmax denotes the maximum value of the measured electric resistivities R, Rmin denotes the minimum value of the measured electric resistivities R.

Figure 2:
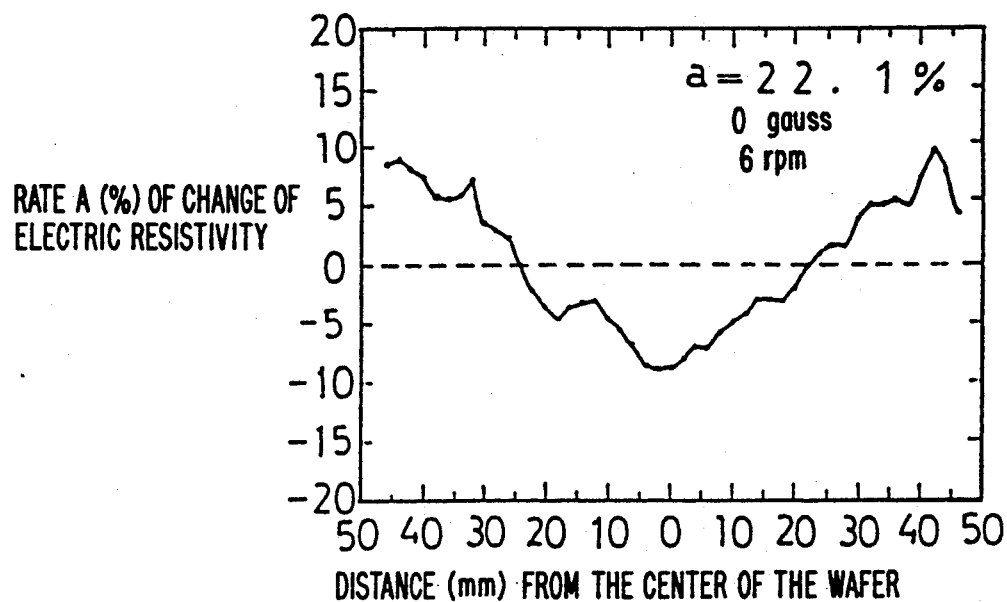
Figure 2:
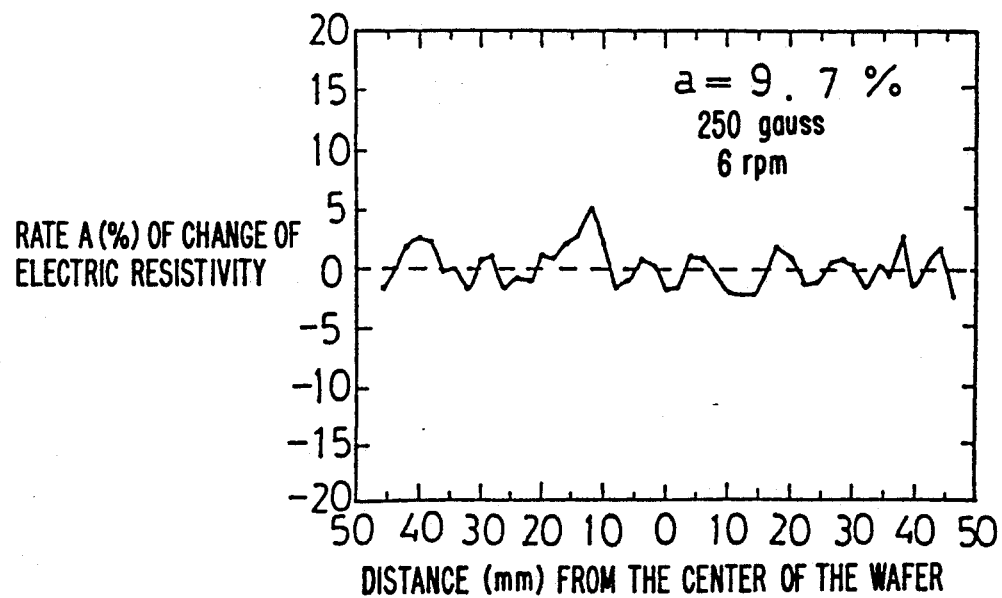

FIG. 2 shows graphs which were obtained by plotting the measured values of the rates A of change of the electric resistivities R in the cross-sectional plane of the silicon wafer obtained by the method of the first example against the distances from the center of the wafer; wherein FIG. 2(a) shows the case wherein a magnetic field was not applied to the melting zone where the silicon monocrystal was being grown and FIG. 2(b) shows the case wherein a magnetic field having an intensity of 250 gauss was applied to the melting zone, the wafer having been cut from the silicon monocrystalline rod (crystal orientation: <111>; phosphorus-doped n-type crystal) having a diameter of 100 mm.

From the measured values from FIGS. 1(a) and 1(b), the rates a of variations of the electric resistivities R in the cross-sectional plane are determined to be 22.1% and 9.7% respectively, and it can be understood that a uniform distribution in the cross-sectional plane can be obtained by the application of a magnetic field.

FIG. 3 is a table showing the rates a of variation of the electric resistivities R in the cross-sectional plane of the sample wafers having diameters of 75 mm, 100 mm, and 125 mm respectively obtained in the method of the first example. Herein the sample wafers were obtained by rotating the lower shaft with the number of rotations varied within a suitable range and varying the magnetic field intensity by a direct electric current having a ripple factor of 3% in the range of 0 to 1,000 gauss.

By reading the lowest possible parts of the rates a of variation of the electric resistivities R in the cross-sectional plane from the table of FIG. 3, it can be understood that the number of rotations of the lower shaft and the magnetic field intensity for suitable growth conditions are 1 to 8 per minute and 190 to 600 gauss respectively. More preferably, the optimum conditions for obtaining the minimum value of the rate a of variation in the cross-sectional plane are such that, in the case of a silicon monocrystalline rod having a diameter of 75 mm, the number of rotations of the lower shaft is 7 per minute and the magnetic filed intensity to be applied is 500 gauss, in the case of a silicon monocrystalline rod having a diameter of 100 mm, the number of rotations of the lower shaft is 6 per minute and the magnetic field intensity to be applied is 250 gauss, and in the case of a silicon monocrystalline rod having a diameter of 125 mm, the number of rotations of the lower shaft is 2 per minute and the magnetic field intensity to be applied is 220 gauss.

As mentioned above, the reason why a good result is obtained when the number of rotations of the lower shaft and the magnetic field intensity to be applied are reduced as the diameter of the wafer increases is considered in such a way that the centrifugal force resulting from the rotation of the lower shaft in the melting zone of the silicon melt and the action caused by the applied magnetic field are balanced in a subtle manner thereby improving the nonuniformity of the distribution of the thickness of the boundary diffused layer.

FIG. 4 is a table showing rates a of variation of the electric resistivities R in the cross-sectional planes of monocrystalline rods having various diameters of the method of the first example which were obtained when the ripple factor involved in the direct current for forming an applied magnetic field was changed in the range of 3 to 15%. From FIG. 4, it is apparent that the range of the ripple factor for the allowable small value of the rate a of variation in the cross-sectional plane is 8% or below.

The method of a preferable second example for the case wherein the diameter of the silicon monocrystalline rod to be grown is over about 130 mm will now be described.

In this method of the second example, the same silicon monocrystalline rod growing apparatus as that used in the method of the first example was employed. The solenoid coil 9 was arranged similarly and doping was carried out by pouring phosphorus as a dopant in the chamber 5, and an n-type silicon monocrystalline rod 3 having a diameter of 150 mm whose growth orientation was <111> was grown and formed.

Herein, direct electric currents having ripple factors of 3%, 8%, and 15% respectively were passed through the solenoid coil 9 so that the measured values of the magnetic intensity at the center of the growth boundary might be varied within the range of 0 to 250 gauss, the number of rotations of the upper shaft 10 was kept constant and was 0.4 per minute, and the number of rotations of the silicon monocrystalline rod 3 to be grown was varied within the range of 0.5 to 4 per minute, with the upper shaft 10 and the silicon monocrystalline rod 3 being rotated in the same direction.

Figure 5A:
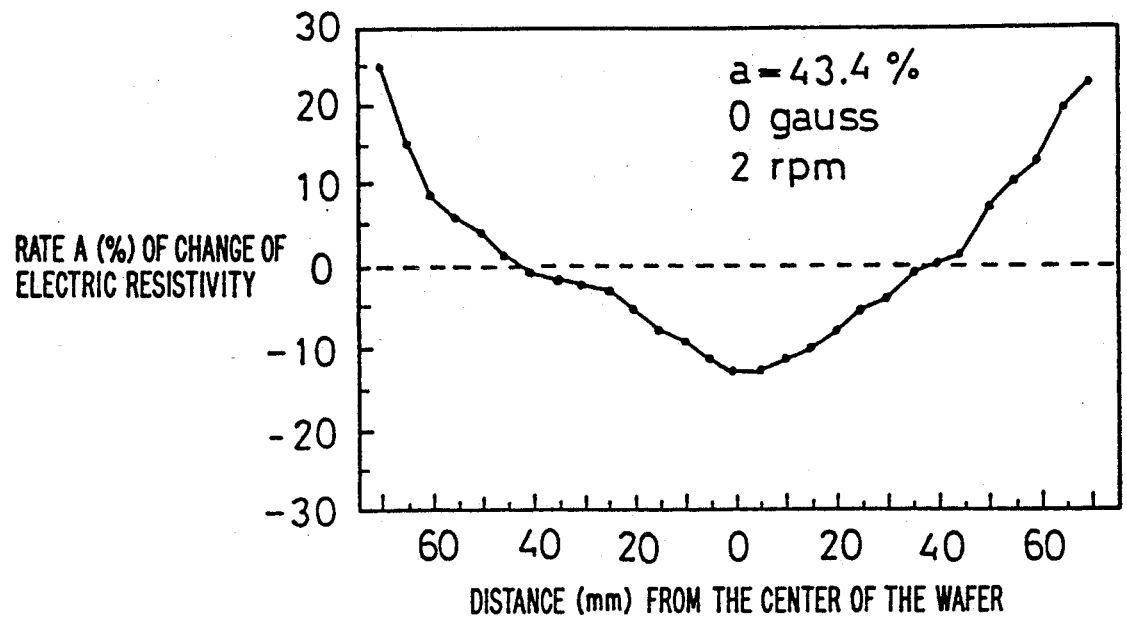
Figure 5B:
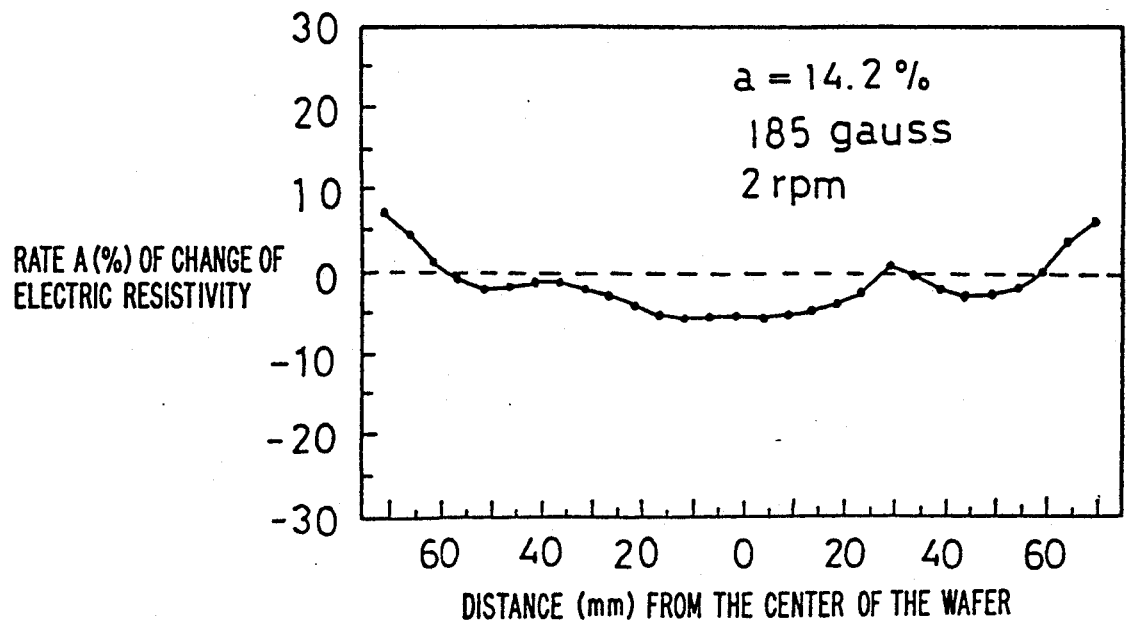
Figure 8:
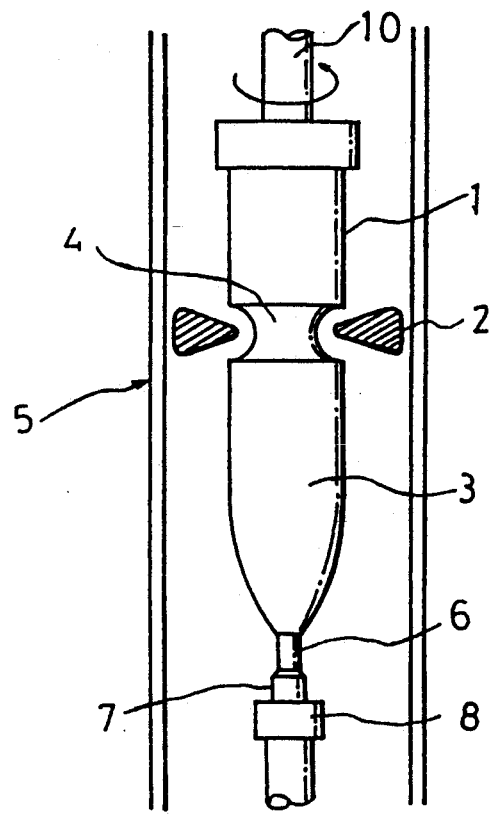
FIG. 8 is a diagram schematically illustrating the construction of a silicon monocrystalline growing apparatus applied to a conventional method of growing a silicon monocrystalline rod.

FIG. 5 shows graphs obtained similarly to those of FIG. 2 by plotting the values of the rates A of change of the electric resistivities R in the method of the second example against the distances from the center of the wafer; wherein FIG. 5(a) illustrates the case wherein the number of rotations of the lower shaft was 2 per minute and a magnetic field was not applied, that is, the magnetic field intensity was 0 gauss and FIG. 5(b) illustrates the case wherein the number of rotations of the lower shaft was 2 per minute and the applied magnetic field intensity was 185 gauss.

FIG. 6 is a table showing the rates a of variation of the electric resistivities R in the cross-sectional plane of the silicon monocrystalline rod obtained in the method of the second example wherein the number of the rotation of the silicon monocrystalline rod was varied within the range of 0.5 to 4 per minute and the intensity of the applied magnetic field was varied within the range of 0 to 250 gauss. It can be understood that, in contrast to the case of the silicon monocrystalline rods having diameters of 75 mm and 100 mm respectively shown in FIG. 3, in the case of the silicon monocrystalline rod having a diameter of 150 mm, the optimum range is moved and reduced, that is, the number of rotations is changed from 0.5 to 5 per minute and the magnetic field intensity is changed from 180 gauss to 200 gauss.

As a case wherein the diameter of the silicon monocrystalline rod is 75 mm to 125 mm or more, in addition to the above case having a diameter of 150 mm, a case having a diameter of 140 mm was also tried and it was found that the optimum range was the same.

FIG. 7 is a table showing the influence of the ripple factor involved in the direct current for applying the magnetic field in the method of the second example upon the rate a of variation of the electric resistivity R in the cross-sectional plane. Herein, although it appears that the allowable upper limit value of the ripple factor decreases as the diameter of the silicon monocrystalline rod increases, the rate a of variation of the electric resistivity R in the cross-sectional plane is about 16% for a ripple factor of 8%, which is apparently a considerable improvement in comparison with the case wherein a magnetic field is not applied.

Further, FIG. 1(a) shows an example of a silicon monocrystal growing apparatus wherein a solenoid 9 is arranged below a melting zone of a silicon melt whereas FIG. 1(b) shows an example a silicon monocrystal growing apparatus wherein a solenoid 9 is arranged above a melting zone of a silicon melt. In these apparatuses, since the magnetic field generated by the solenoid coil 9 includes the melting zone of the silicon melt and the crystal growth region, it is expected that the magnetic field has an effect on both the melting zone and the crystal growth region. Further solenoids 9 may be arranged below and above the high-frequency induction heating coil at the outer wall part of the chamber 5. In that case if the magnetic fields formed by the solenoid coils 9 are in the same direction, the magnetic field intensities formed by them each will bear half of the magnetic field intensity of the case having only one solenoid coil 9 arranged to secure the same effect as above while in the case if the magnetic fields formed by the solenoid coils 9 are in opposite directions, the difference between the magnetic field intensities is made approximately equal to the magnetic field intensity of the case having only one solenoid 9 arranged, so that the same effect as above can be secured.

Thus, as described in detail with reference to the methods of the examples, according to the present invention, a method of growing a silicon monocrystalline rod having a relatively large diameter of 75 mm or over by an FZ process can be provided, wherein the dopant distribution in the cross-sectional plane of the silicon monocrystalline rod can be made uniform easily in a microscopic sense and since a doping step using irradiation with thermal neutrons during the growth by an FZ process is not involved, such an excellent advantage can be obtained that the silicon monocrystalline rod can be grown and formed at a desired production cost.

What is claimed is:

1. A method of growing and forming a silicon monocrystalline rod by a floating zone process comprising the steps of melting a portion of a silicon rod by means of an annular induction heating element to form a melting zone; regrowing the melted silicon rod in contact with a seed crystal as a single crystal rod in a crystallization zone adjacent said melting zone; moving said silicon rod relative to said heating element to move said melting zone and said crystallization zone along said rod, and providing a magnetic field forming means surrounding said silicon rod adjacent said melting zone to apply a magnetic field to said melting zone, wherein said silicon rod has a diameter of from 70 to about 130 mm, said magnetic field has a field strength of from 190 to 600 gauss, and said single crystal rod to be grown is rotated at from 1 to 8 rotations per minute.

2. A method of growing a silicon monocrystalline rod according to claim 1, wherein said magnetic field forming means is a solenoid coil arranged to surround the silicon rod, and a direct electric current is passed through said solenoid coil.

3. A method of growing a silicon monocrystalline rod according to claim 2, wherein said direct electric current has a ripple factor restricted to 8% or below.

4. A method of growing and forming a silicon monocrystalline rod by a floating zone process comprising the steps of melting a portion of a silicon rod by means of an annular induction heating element to form a melting zone; regrowing the melted silicon rod in contact with a seed crystal as a single crystal rod in a crystallization zone adjacent said melting zone; moving said silicon rod relative to said heating element to move said melting zone and said crystallization zone along said rod, and providing a magnetic field forming means surrounding said silicon rod adjacent said melting zone to apply a magnetic field to said melting zone, wherein said silicon rod has a diameter of at least about 130 mm, said magnetic field has a field strength of from 185 to 200 gauss, and said single crystal rod to be grown is rotated at from 0.5 to 4 rotations per minute.

5. A method of growing a silicon monocrystalline rod as claimed in claim 4, characterized in that said magnetic field forming means is a solenoid coil arranged to surround the silicon monocrystalline rod to be grown and a direct electric current is passed through said solenoid coil.

6. A method of growing a silicon monocrystalline rod as claimed in claim 5, characterized in that the ripple factor of the direct current passing through the solenoid serving as said magnetic field forming means is restricted to 8% or below.

* * * * *